United States Patent
Drane

(10) Patent No.: US 7,851,703 B2
(45) Date of Patent: Dec. 14, 2010

(54) GASKET SEALING AND INSTALLATION PROCESS FOR DOOR GASKET ON WEATHERPROOF OUTLET ELECTRICAL BOX

(75) Inventor: Mark R. Drane, Germantown, TN (US)

(73) Assignee: Thomas & Betts International, Inc., Wilmington, DE (US)

( * ) Notice: Subject to any disclaimer, the term of this patent is extended or adjusted under 35 U.S.C. 154(b) by 276 days.

(21) Appl. No.: 12/211,155

(22) Filed: Sep. 16, 2008

(65) Prior Publication Data

US 2009/0078441 A1    Mar. 26, 2009

Related U.S. Application Data

(60) Provisional application No. 60/995,339, filed on Sep. 26, 2007.

(51) Int. Cl.
*H05K 5/06* (2006.01)
(52) U.S. Cl. .............. 174/50; 174/66; 174/58; 439/106; 427/256; 227/630
(58) Field of Classification Search ............ 174/50, 174/66, 67, 58; 220/4.02, 241, 242, 326; 277/650, 628, 630; 427/256; 439/106, 107, 439/535
See application file for complete search history.

(56) References Cited

U.S. PATENT DOCUMENTS

| | | | |
|---|---|---|---|
| 3,770,480 A | 11/1973 | Farnam | |
| 4,483,539 A | 11/1984 | Bindel et al. | |
| 4,484,021 A | 11/1984 | Schaefer et al. | |
| 4,560,083 A * | 12/1985 | Danico | 220/786 |
| 4,625,979 A | 12/1986 | Inciong | |
| 4,715,609 A | 12/1987 | Mino et al. | |
| 4,803,307 A | 2/1989 | Shotey | |
| 5,280,135 A | 1/1994 | Berlin et al. | |
| 5,368,315 A | 11/1994 | Viksne | |
| 6,273,426 B1 | 8/2001 | Daoud et al. | |
| 6,629,365 B2 | 10/2003 | Denzene et al. | |
| 6,673,455 B2 | 1/2004 | Zumbrum et al. | |
| 6,921,081 B2 | 7/2005 | Wobben | |
| 7,044,475 B2 | 5/2006 | Imai et al. | |
| 7,129,413 B1 | 10/2006 | Rao et al. | |
| 7,554,033 B1 * | 6/2009 | Bhosale et al. | 174/53 |
| 2001/0004316 A1 | 6/2001 | Denzene et al. | |
| 2001/0033059 A1 | 10/2001 | Forry et al. | |
| 2003/0230856 A1 | 12/2003 | Forry et al. | |
| 2004/0007828 A1 | 1/2004 | Forry et al. | |
| 2007/0137845 A1 | 6/2007 | Desai | |

* cited by examiner

*Primary Examiner*—Dhiru R Patel
(74) *Attorney, Agent, or Firm*—Hoffman & Baron, LLP

(57) ABSTRACT

The present invention is directed to a sealing member for establishing a water resistant seal between two elements which includes a resilient gasket having opposed gasket surfaces for engagement between the two elements; and a water resistant coating applied to the gasket. The water resistant coating providing releasable adhesive sealing contact with at least one of the elements. The present invention is also directed to a method of making a gasket seal for an electrical box.

14 Claims, 3 Drawing Sheets

GASKET SEALING AND INSTALLATION PROCESS FOR DOOR GASKET ON WEATHERPROOF OUTLET ELECTRICAL BOX

CROSS-REFERENCE TO RELATED APPLICATION

This application claims priority to U.S. Provisional Patent Application No. 60/995,339 on Sep. 26, 2007, herein incorporated by reference.

FIELD OF THE INVENTION

This invention relates to a sealing member, and more particularly to a sealing member such as a gasket used to prevent water ingress in a wet location and provides weatherproof protection to the covered component.

BACKGROUND OF THE INVENTION

Electrical boxes are used for a variety of applications wherein it is necessary to provide a termination point for electrical wires for splicing or connection to an electrical component. An electrical box is rigidly mounted on or in a wall in such locations to conveniently locate an electrical component. Depending on the application and location, electrical boxes can be mounted either in a horizontal or vertical orientation. Once mounted, the wires installed and connected to the electrical component therein, the box is closed with a faceplate. The faceplate must be chosen to match the installed electrical component, and covers the top opening of the connector box, thus preventing any damage to the components mounted in the box or accidental contact with live electrical wires.

Due to the varied needs for electrical power and switching, it is sometimes necessary to mount a box in a location where it will be exposed to wet conditions. Typically, such installations can include an outdoor receptacle to provide electricity for lighting, power tools or appliances. When used in a location where the connector box will be exposed to water, it is necessary to provide for structure to ensure that water does not enter the box and thereby damage the components therein or cause a "short circuit".

A gasket may be installed between the cover frame and cover door. Oftentimes, the gasket is installed by using a sticky tape that includes a peel and stick adhesive to adhere the gasket to the cover or may rely on mechanical interference between the gasket and the cover frame. However, the gasket is a generic pre-cut material that rests in the cover. It is not molded with the contours of the cover frame and cover door so it has limitations on water determent. The gasket is also not capable of sealing the edges of the cover door and cover frame. So water leaks through the raw edges of the gasket into the frame. Additionally, once the gasket is stuck in the door it is irreversibly attached to the cover door. The gasket cannot to be repositioned without damaging the gasket.

It would therefore be desirable to have a gasket that provides a weatherproof seal including improved sealing abilities and edge sealing capabilities. Additionally, it would be desirable to provide for a gasket that can be repositioned during assembly without causing damage to the gasket, cover frame or cover door.

SUMMARY OF THE INVENTION

The present invention is directed to a sealing member for establishing a water resistant seal between two elements which includes a resilient gasket having opposed gasket surfaces for engagement between the two elements; and a water resistant coating applied to the gasket. The water resistant coating providing releasable adhesive sealing contact with at least one of the elements as well as providing anti-wicking characteristics to the edges of the gasket.

Another embodiment of the present invention includes a water resistant electrical box assembly including an electrical box having a perimetrical rim thereabout, a cover movably positioned on a box for overlying engagement against a rim, and a resilient gasket positionable on the rim for resilient sealing engagement with a cover. The gasket including a water resistant coating thereon for establishing a releasable adhesive sealing coating with the rim.

A further embodiment includes a method of waterproofing an electrical box cover which includes die cutting a closed cell structured gasket material to desired shape, coating the gasket surfaces with a water resistant coating creating a wetted gasket, releasably adhering one side of the wetted gasket on a surface of the electrical box cover; closing the electrical cover to allow the gasket to be imprinted on the other side by the interior surface of the electrical box; holding the electrical cover in a closed position while the wetted gasket dries; and drying the wetted gasket to form a mechanical attachment of the one side of the gasket and the cover, and a permanent customized imprinting of the interior surface of the electrical box to the other side of the gasket.

DETAILED DESCRIPTION OF THE PREFERRED EMBODIMENT

The present invention is directed to a coated cover door gasket and method of making the same to provide a weatherproof cover for an electrical box and provide water protection to components accommodated.

Figure 1:
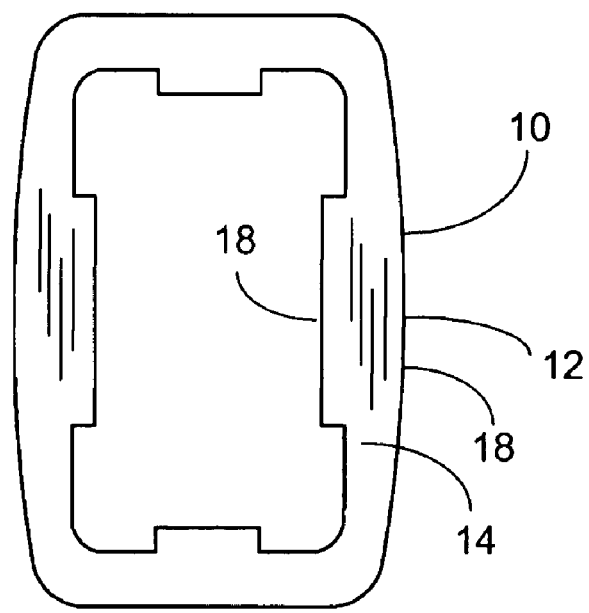
FIG. 1 is a planar view of the gasket of the present invention.

FIG. 1 shows a coated gasket 10 of the present invention. The base gasket 12 material is made from a flexible plastic material such as polyethylene, or any other suitable resinous material, and is formed into the appropriate shape to correspond to the cover 20. The base gasket 12 is preferably made from a closed cell foam material. The gasket 10 of FIG. 1 is generally rectangular in shape with a cut out in the center.

The base gasket 12 may be manufactured by a die cutting method. The sheet of gasket base 12 material is subjected to an initial or preliminary die-cutting operation, which die-cutting is accomplished with a single or multiple die; multiple dies being preferred in order to make the method as efficient as possible. The dies will have a specific configuration, depending upon the end configuration of the desired gasket. In the case illustrated, a center hole is cut from the sheet and the exterior gasket shape is cut to form the continuous band of base gasket 12 material. The exposed edges 18 of the gasket have an open-celled structure due to the die cutting through the closed cell material structure creating an open celled structure.

The base gasket 12, as shown in FIGS. 1-5, is then coated with the coating agent or sealer material 14. Coating of the base gasket 12 is preferably accomplished by means of spray coating, dip coating or other means, which allows for the liquid sealer 14 to coat all of the surfaces of the base gasket 12 and seal all surfaces of the base gasket 12 including the exposed raw open celled edges. The sealer 14 is ideally continuous about the entire base gasket 12 surfaces and sides, enveloping the base gasket 12 and repelling water ingress. The exposed edges 18 include an open-cell structure, which is susceptible to the ingress of water via wicking or the like. The sealer 14 creates barrier which prevents fluid from entering the open-cell structure of the gasket and migrating into the interior of the box thru the gasket material itself. The sealer 14 can be a clear or colorless material, or a colored material to provide visual confirmation that the gasket 12 was covered with sealer 14.

Figure 2:
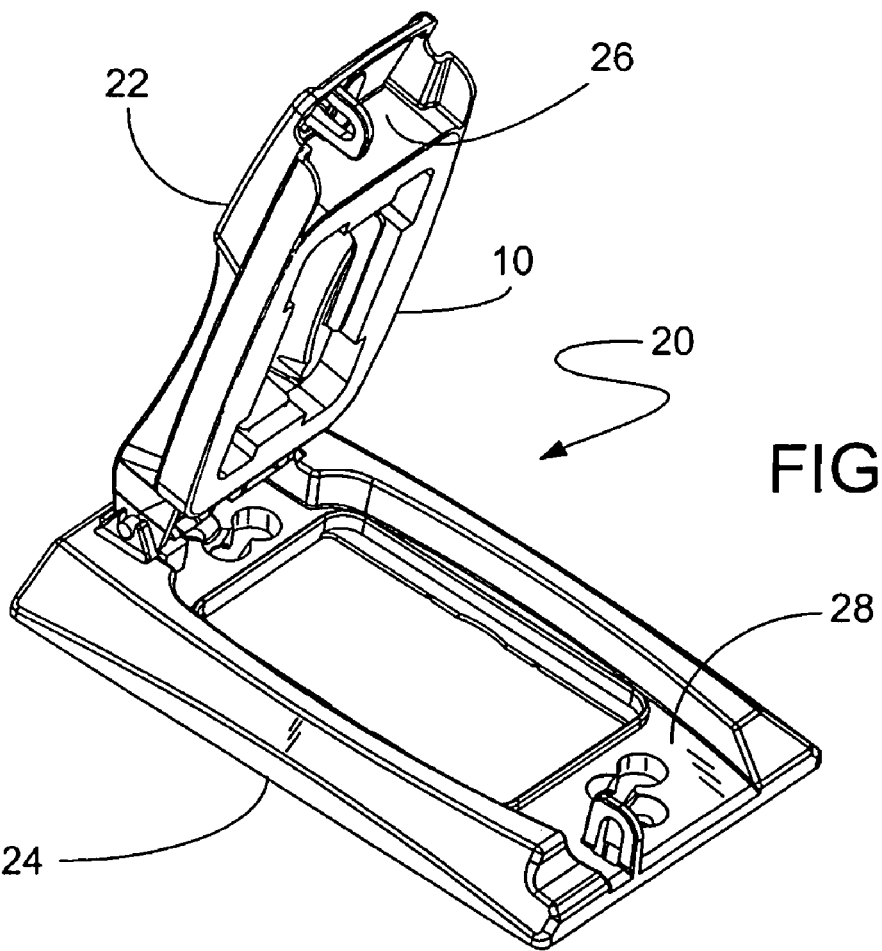
FIG. 2 is a perspective view of the wetted gasket being placed in a cover frame.

After the base gasket 12 has been coated with the sealer composition 14, it is inserted onto the cover door 22 before the sealer 14 has dried, as shown in FIG. 2. This allows for repositioning of the gasket 10 in the door 22 while the gasket 10 is still wet or damp. The sealer 14 is not tacky or sticky when wet and allows for repositioning during insertion and placement within the cover 20 including the cover door 22 and cover frame 24.

Figure 3:
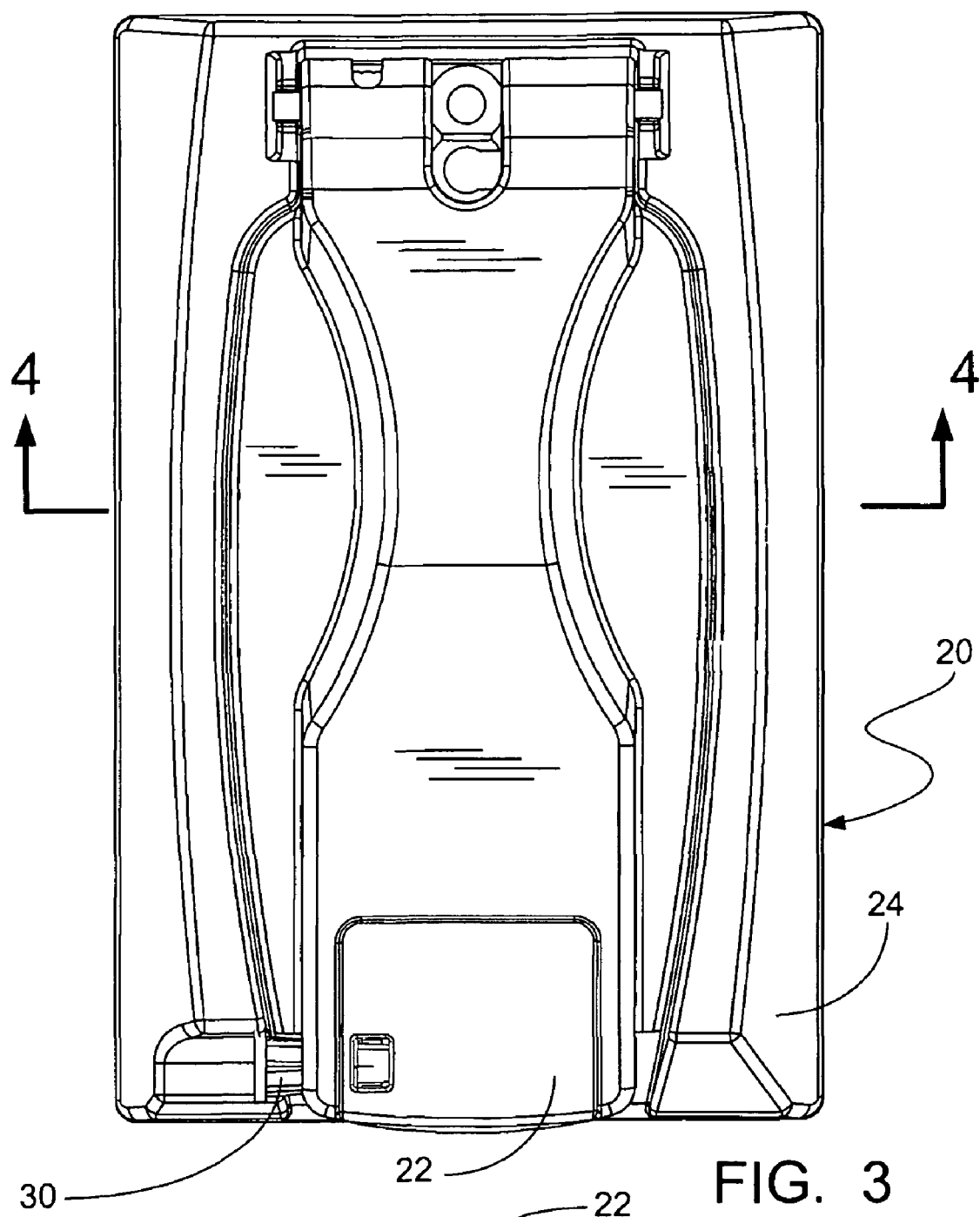
FIG. 3 is a planar view of the cover frame in the closed position with a coated gasket therein.
Figure 4:
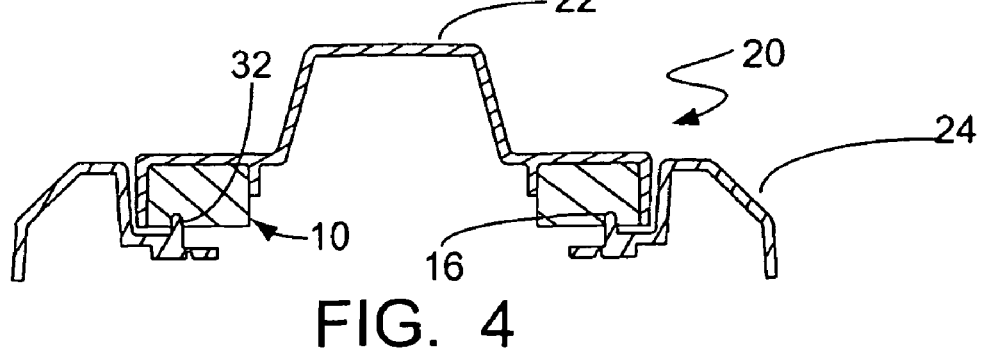
FIG. 4 is a cross-sectional view of the closed cover frame with a coated gasket therein.

Once the wetted gasket 10 is properly positioned within the cover 20, the cover door 22 is closed against the cover frame 24, as shown in FIGS. 3 and 4. To ensure that the gasket 10 is firmly pressed against both the cover door 22 interior surface 26 and the cover frame 24 interior surface 28 a device can be used to maintain the cover 20 in the closed position. For example, a pin, clamp or strong springs can be used to hold the cover 20 in a closed position. Alternately, the spring bias or other closing mechanism used to close the door 22 against the frame 24 may be sufficient to hold cover 2 in the closed position. Hence, the sealer 14 dries or cures while the door 22 is closed; this helps the gasket 10 to maintain a three-dimensional shape and create a custom mateable surface that matches the contours of the interior surface 26 of the cover door 22 and the contours of the cover frame 24.

Figure 5:
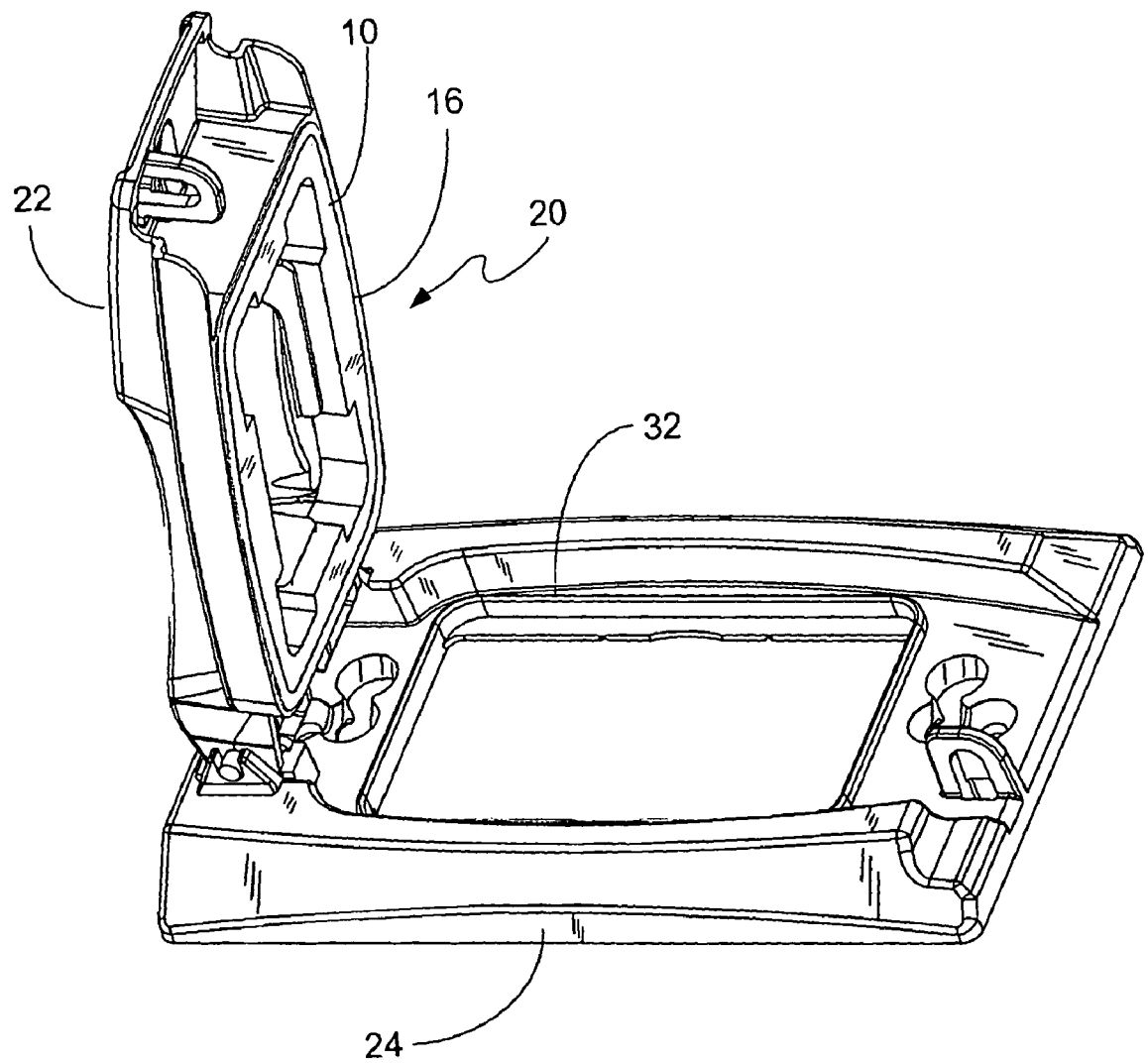
FIG. 5 is a perspective view of the cover frame in the open position with a coated gasket in the door.

FIG. 3 shows a pin 30 maintaining the door 22 in the closed state as the sealer 14 cures via thermal curing, light curing, evaporation or other forms of curing as know in the art depending of the sealer 14 used. FIG. 5 shows the gasket 10 adhering to the cover door 22 on all surfaces in which the door 22 is in contact with the gasket. The sealer 14, when dried, acts as a mechanical bonding agent between the contacted surfaces. As shown, the gasket 10 also has a groove 16 and other impressions mirroring the cover frame 24 resulting from the curing of the sealer while the gasket 10 was thusly compressed. FIGS. 4 and 5 show the gasket 10 after the sealer 14 has cured. The gasket 10 includes the indentation created by the sealing rib 32 of the cover frame 24 to allow for the gasket 10 to repeatedly mate with the rib 32 of the frame 24 and create a water barrier on either side of the sealing rib 32. The sealer 14 allows the gasket 10 to be custom molded within or conform to the door 22 and the frame 24 by maintaining the impressions and contours in the coated gasket. Upon closing the cover door 22, the gasket 10 will mate with the cover frame 24 inside surface walls, which provides a better seal between the gasket 10 and the cover 20.

It will be appreciated that the present invention has been described herein with reference to certain preferred or exemplary embodiments. The preferred or exemplary embodiments described herein may be modified, changed, added to or deviated from without departing from the intent, spirit and scope of the present invention. It is intended that all such additions, modifications, amendments, and/or deviations be included within the scope of the claims appended hereto.

What is claimed is:

1. A sealing member for establishing a water resistant seal between two elements comprising: a resilient gasket having opposed gasket surfaces for engagement between said two elements; and a water resistant coating applied to said gasket, said water resistant coating providing releasable and repositionable adhesive sealing contact prior to curing of said water resistant coating with at least one of said elements, wherein said gasket includes open-cell structure edges and said sealing member encapsulates said edges preventing fluid migration therein.

2. A sealing member of claim 1, wherein said water resistant coating is applied as a liquid.

3. A sealing member of claim 2, wherein said sealing member is applied by dip coating.

4. A sealing member of claim 2, wherein said sealing member is applied by spray coating.

5. A sealing member of claim 2, wherein said liquid coating is dryable in place.

6. A sealing member of claim 5, wherein said liquid coating provides adhesive attachment to said at least one surface upon drying.

7. A sealing member of claim 1, wherein said water resistant coating is colored to provide visual confirmation that the gasket was covered with the coating.

8. A sealing member of claim 1, wherein said water resistant coating is colorless.

9. A water resistant electrical box assembly comprising:
an electrical box having a perimetrical rim thereabout; a cover movably positioned on said box for overlying engagement against said rim; and a resilient gasket positionable on said rim for resilient sealing engagement with said cover; said gasket including a water resistant coating thereon for establishing a releasable adhesive sealing coating with said rim, wherein said gasket includes open-cell structure edges and said water resistant coating encapsulates said edges preventing fluid migration therein.

10. The water resistant electrical box assembly of claim 9, wherein said water resistant coating provides adhesive attachment to said cover upon drying of said coating.

11. A method of waterproofing an electrical box cover comprising:
die cutting a closed cell structured gasket material to desired shape to form edges on said gasket wherein said edges have an open-cell structure; coating gasket with a water resistant coating creating a wetted gasket, said coating step further including coating said open-cell structure of said edges and encapsulating said open-cell structure with said water resistant coating to prevent fluid migration therein;
and releasably adhering one side of said wetted gasket on a surface of said electrical box cover.

12. The method of waterproofing an electrical box cover of claim 11, wherein said electrical box cover includes a cover door having a surface attached to a cover frame having an interior surface, further including the step of closing said electrical cover to allow said gasket to be imprinted in another side of said wetted gasket by contacting the interior surface of said cover frame forming a groove.

13. The method of waterproofing an electrical box cover claim 12, further including the step of maintaining said electrical cover in a closed position while said wetted gasket is dries.

14. The method of waterproofing an electrical box cover claim 13, further including the step of drying said wetted gasket to form a mechanical attachment of the one side of the gasket and the cover and customized imprinting of the interior surface of the electrical box to the another side of the gasket.

* * * * *